United States Patent
Ohtaka

(10) Patent No.: US 9,078,338 B2
(45) Date of Patent: Jul. 7, 2015

(54) PROTECTIVE COVER FOR AN ELECTRONIC DEVICE

(71) Applicant: Casio Computer Co., Ltd., Shibuya-ku, Tokyo (JP)

(72) Inventor: Masatoshi Ohtaka, Hidaka (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 74 days.

(21) Appl. No.: 13/928,201

(22) Filed: Jun. 26, 2013

(65) Prior Publication Data
US 2014/0029177 A1    Jan. 30, 2014

(30) Foreign Application Priority Data
Jul. 24, 2012 (JP) ................... 2012-163474

(51) Int. Cl.
G06F 1/16 (2006.01)
H05K 7/00 (2006.01)
A45C 11/00 (2006.01)

(52) U.S. Cl.
CPC .............. *H05K 7/00* (2013.01); *G06F 1/1628* (2013.01); *G06F 1/166* (2013.01); *A45C 2011/003* (2013.01); *A45C 2200/15* (2013.01)

(58) Field of Classification Search
CPC .................................................. G06F 1/1656
USPC ................................................... 361/679.56
See application file for complete search history.

(56) References Cited

U.S. PATENT DOCUMENTS

| | | | | |
|---|---|---|---|---|
| 6,829,140 B2 * | 12/2004 | Shimano et al. | ......... | 361/679.09 |
| 6,967,836 B2 * | 11/2005 | Huang et al. | ............. | 361/679.46 |
| 7,886,903 B1 * | 2/2011 | Wurzelbacher et al. | ...... | 206/320 |
| 8,310,826 B2 * | 11/2012 | Wu et al. | .................... | 361/679.3 |
| D674,803 S * | 1/2013 | Westrup | ....................... | D14/440 |
| 8,749,960 B2 * | 6/2014 | Mori | ........................ | 361/679.03 |
| 2006/0007645 A1 * | 1/2006 | Chen et al. | .................... | 361/681 |
| 2006/0092602 A1 * | 5/2006 | Hou et al. | ..................... | 361/679 |
| 2010/0294683 A1 * | 11/2010 | Mish et al. | .................... | 206/320 |
| 2011/0075339 A1 * | 3/2011 | Lam | .......................... | 361/679.09 |
| 2011/0290687 A1 * | 12/2011 | Han | .............................. | 206/320 |
| 2012/0012483 A1 * | 1/2012 | Fan | .............................. | 206/320 |
| 2012/0037523 A1 * | 2/2012 | Diebel et al. | ................. | 206/320 |
| 2012/0043247 A1 * | 2/2012 | Westrup | ....................... | 206/472 |
| 2012/0234716 A1 * | 9/2012 | Chen | ............................ | 206/472 |
| 2012/0268891 A1 * | 10/2012 | Cencioni | .................. | 361/679.55 |
| 2013/0083465 A1 * | 4/2013 | Motoishi et al. | ......... | 361/679.21 |
| 2013/0134061 A1 * | 5/2013 | Wu et al. | ....................... | 206/320 |
| 2013/0140194 A1 * | 6/2013 | Han | ............................ | 206/45.23 |

FOREIGN PATENT DOCUMENTS

JP      2007-127980 A     5/2007

* cited by examiner

*Primary Examiner* — Anthony Q Edwards
(74) *Attorney, Agent, or Firm* — Holtz, Holtz, Goodman & Chick PC

(57) ABSTRACT

An electronic device of the present invention includes a first flat section which is positioned on a back surface side of a flat-type device body, a second flat section which openably and closably covers a front surface of the device body, and a coupling section which couples the first flat section and the second flat section together such that the first flat section and the second flat section are foldable. The first flat section has a first folding section provided in parallel with the coupling section, and the second flat section has a second folding section provided in parallel with the coupling section.

2 Claims, 12 Drawing Sheets

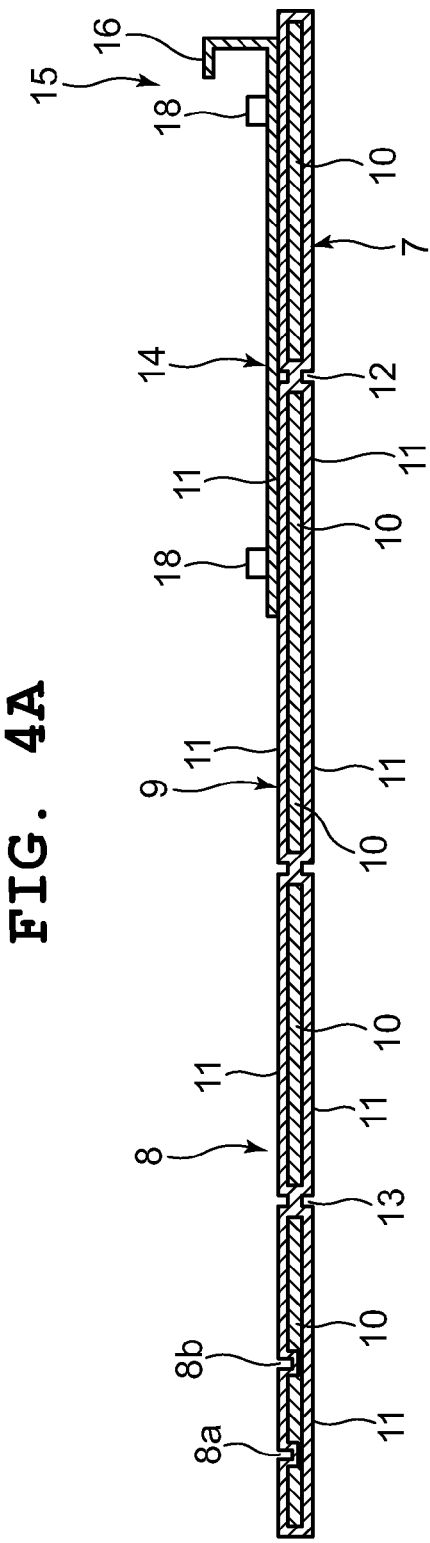
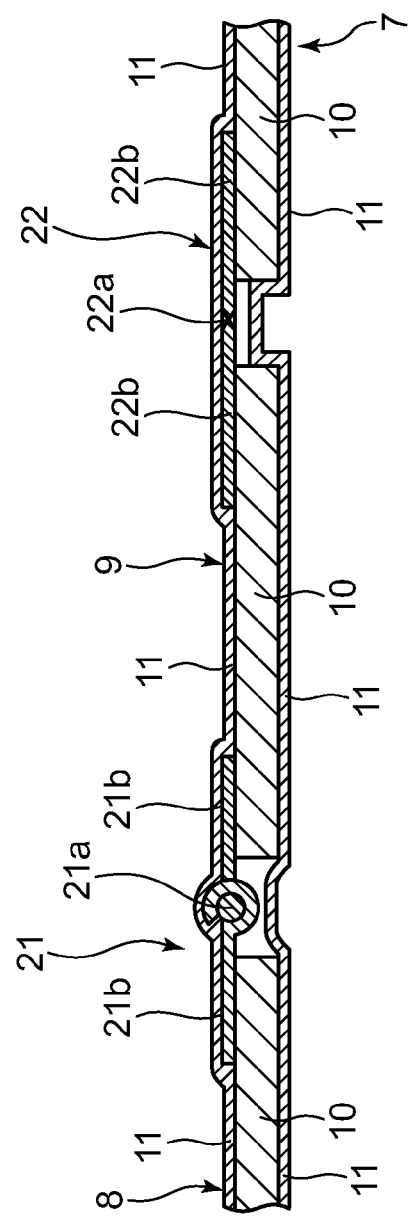
FIG. 4A
FIG. 4B

FIG. 6A
FIG. 6B
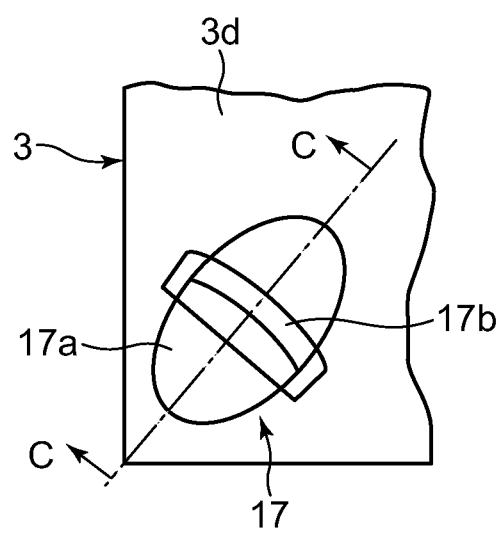
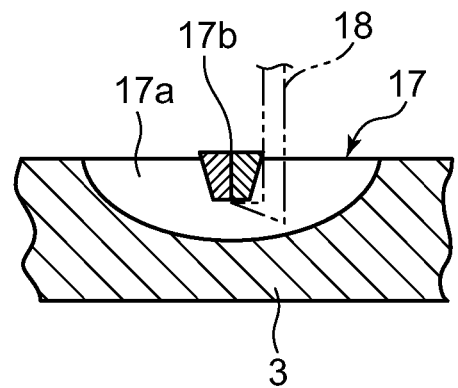

PROTECTIVE COVER FOR AN ELECTRONIC DEVICE

CROSS-REFERENCE TO RELATED APPLICATION

This application is based upon and claims the benefit of priority from the prior Japanese Patent Application No. 2012-163474, filed Jul. 24, 2012, the entire contents of which are incorporated herein by reference.

BACKGROUND OF THE INVENTION

1. Field of the Invention

The present invention relates to electronic devices such as portable information terminal devices.

2. Description of the Related Art

For example, a flat-type electronic device is known, which is structured to include a case cover section where the device body is placed and a lid cover section rotatably mounted on the case cover section to cover the front surface of the device body, as described in Japanese Patent Application Laid-Open (Kokai) Publication No. 2007-127980.

This type of electronic device is structured such that the lid cover section rotates to openably and closably cover the front surface of the device body, with the device body being accommodated in the case cover section formed approximately in a box or frame shape. This is merely a structure where the lid cover section only opens and closes, which is inconvenient in that various usage according to use situations cannot be achieved.

SUMMARY OF THE INVENTION

The present invention is to allow usage according to various use situations and enhance usability.

In accordance with one aspect of the present invention, there is provided an electronic device comprising: a first flat section which is positioned on a back surface side of a flat-type device body; a second flat section which openably and closably covers a front surface of the device body; and a coupling section which couples the first flat section and the second flat section together such that the first flat section and the second flat section are foldable, wherein the first flat section has a first folding section provided in parallel with the coupling section, and the second flat section has a second folding section provided in parallel with the coupling section.

According to the present invention, the front surface of the device body positioned on the first flat section can be openably and closably covered by the second flat section. In addition, the first folding section of the first flat section and the second folding section of the second flat section can be selectively folded according to the use situation of the device body. Therefore, usage according to various use situations is possible, whereby usability is enhanced.

The above and further objects and novel features of the present invention will more fully appear from the following detailed description when the same is read in conjunction with the accompanying drawings. It is to be expressly understood, however, that the drawings are for the purpose of illustration only and are not intended as a definition of the limits of the invention.

BRIEF DESCRIPTION OF THE DRAWINGS

FIG. 4A and FIG. 4B each depict a cross section of the protective cover depicted in FIG. 3, of which FIG. 4A is a sectional view of the protective cover taken along line A-A in FIG. 3, and FIG. 4B is an enlarged sectional view of the main portion taken along line B-B in FIG. 3;

FIG. 6A and FIG. 6B depict an engaging section of the device case depicted in FIG. 5, of which FIG. 6A is an enlarged view of the main portion thereof, and FIG. 6B is an enlarged sectional view of the main portion taken along line C-C;

FIG. 7A and FIG. 7B depict a click-feeling providing section depicted in FIG. 2, of which FIG. 7A is an enlarged perspective view thereof and FIG. 7B is an enlarged sectional view of the main portion thereof taken along line D-D;

FIG. 8A to FIG. 8C each depict a use mode of the protective cover depicted in FIG. 2, of which FIG. 8A is a side view depicting the state in which the electronic device is leaned against the protective cover, FIG. 8B is a side view depicting the state in which the protective cover is used as a paper table for recording paper sheets, and FIG. 8C is a side view depicting the state in which the electronic device is used with a recording paper sheet interposed between the protective cover and the device case;

DETAILED DESCRIPTION OF THE PREFERRED EMBODIMENTS

First Embodiment

A first embodiment in which the present invention has been applied to an electronic device is described below with reference to FIG. 1 to FIG. 8C.

Figure 1:
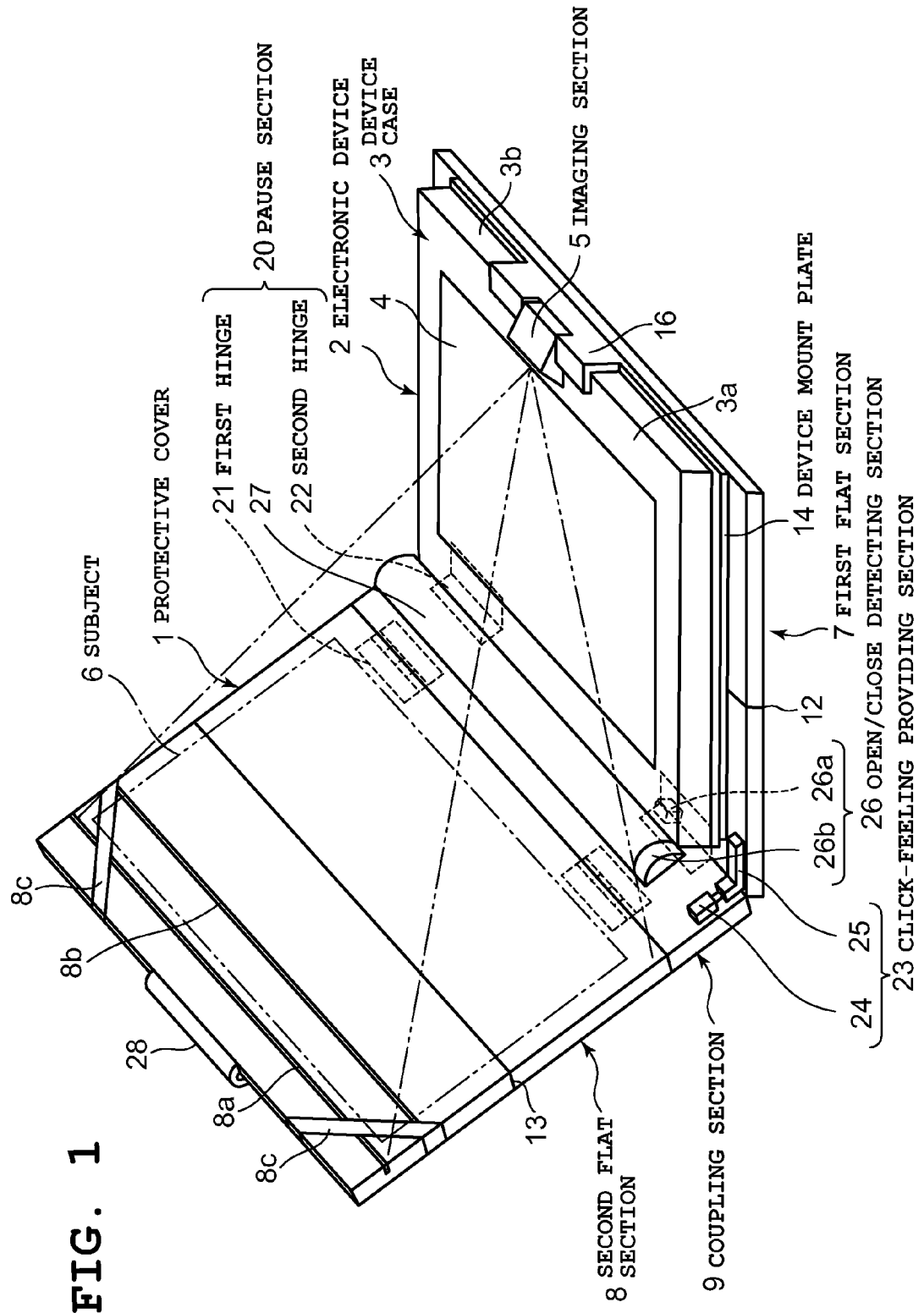
FIG. 1 is a perspective view of a first embodiment in use, in which the present invention has been applied to an electronic device.
Figure 2:
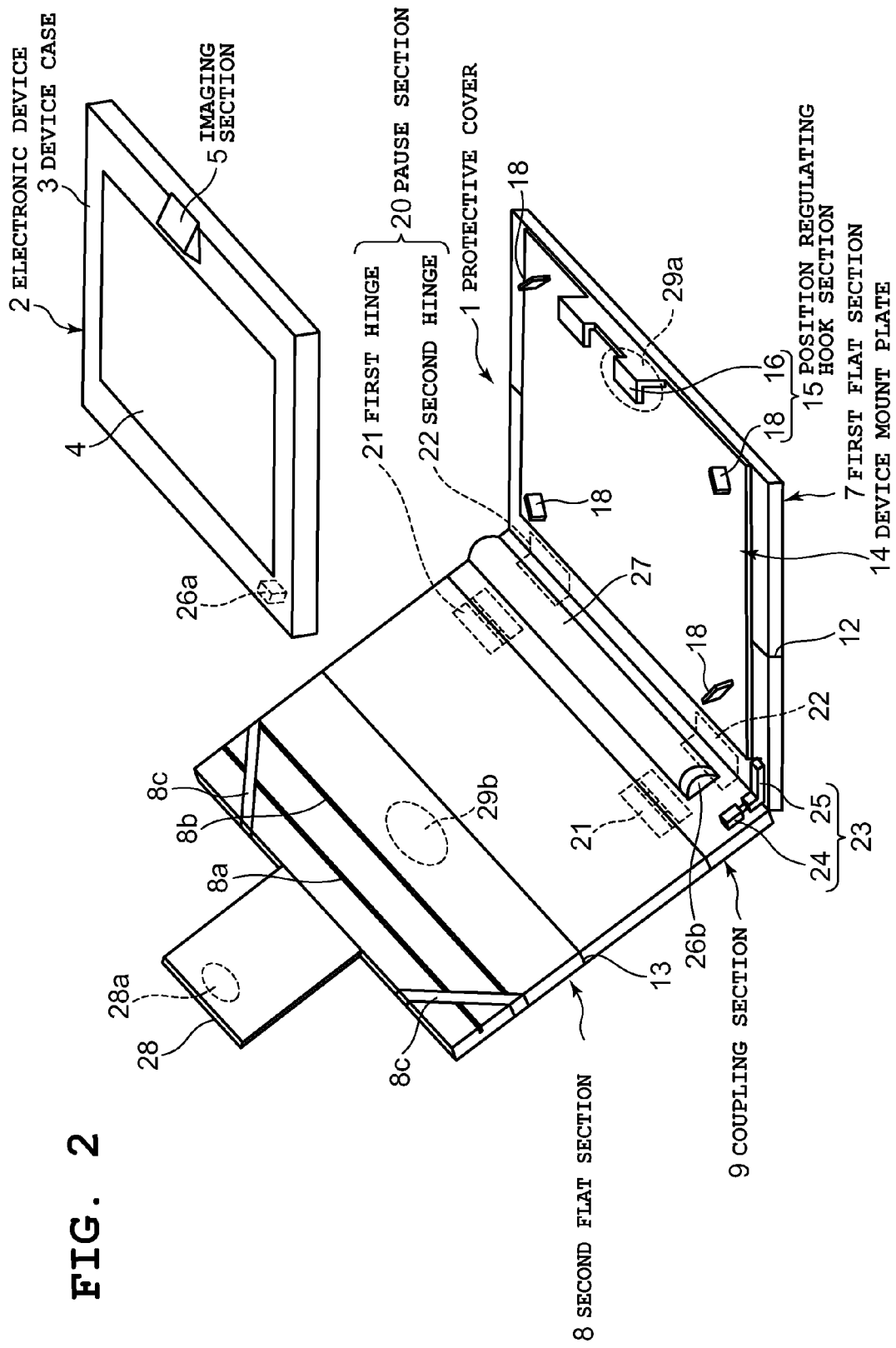
FIG. 2 is a perspective view of a protective cover and the electronic device depicted in FIG. 1 when they are detached.

As depicted in FIG. 1 and FIG. 2, a protective cover 1 is foldable and covers a flat-type electronic device 2 for protection.

In this case, the electronic device 2 is a tablet terminal device, and includes a flat-plate-shaped device case 3. The device case 3 has a front surface 3a provided with an input display section 4 and an imaging section 5.

As depicted in FIG. 1 and FIG. 2, the input display section 4 is structured by a display panel being placed on the lower surface of a touch panel, and is placed over an approximately entire area of the front surface 3a of the device case 3.

The input display section 4 is structured so that when the touch panel is touched while information displayed on the display panel is being viewed, display contents are switched and other information is inputted.

The imaging section 5 is a digital camera section and, as depicted in FIG. 1 and FIG. 2, is provided at one side portion 3b of the front surface 3a of the device case 3.

That is, as depicted in FIG. 1, the imaging section 5 is structured to image a subject 6 placed on another side portion 3c side of the device case 3 across the input display section 4.

In this case, the subject 6 is, for example, a business card or a writing paper sheet containing a memo.

On the other hand, the protective cover 1 includes a first flat section 7 where the back surface 3d of the electronic device 2 is placed, a second flat section 8 which openably and closably covers the front surface 3a of the electronic device 2, and a coupling section 9 which foldably couples the first flat section 7 and the second flat section 8 together.

As depicted in FIG. 4A and FIG. 4B, the first flat section 7, the second flat section 8, and the coupling section 9 are each structured by an intermediate plate 10 made of synthetic resin and a cover sheet 11 covering the intermediate plate 10.

That is, the intermediate plate 10 is made of hard synthetic resin such as polypropylene, and is formed for each of the first flat section 7, the second flat section 8, and the coupling section 9 independently.

The cover sheet 11 is made of synthetic leather, natural leather, soft synthetic resin, or the like, and is formed to cover along the intermediate plates 10 of the first flat section 7, the second flat section 8, and the coupling section 9.

Figure 3:
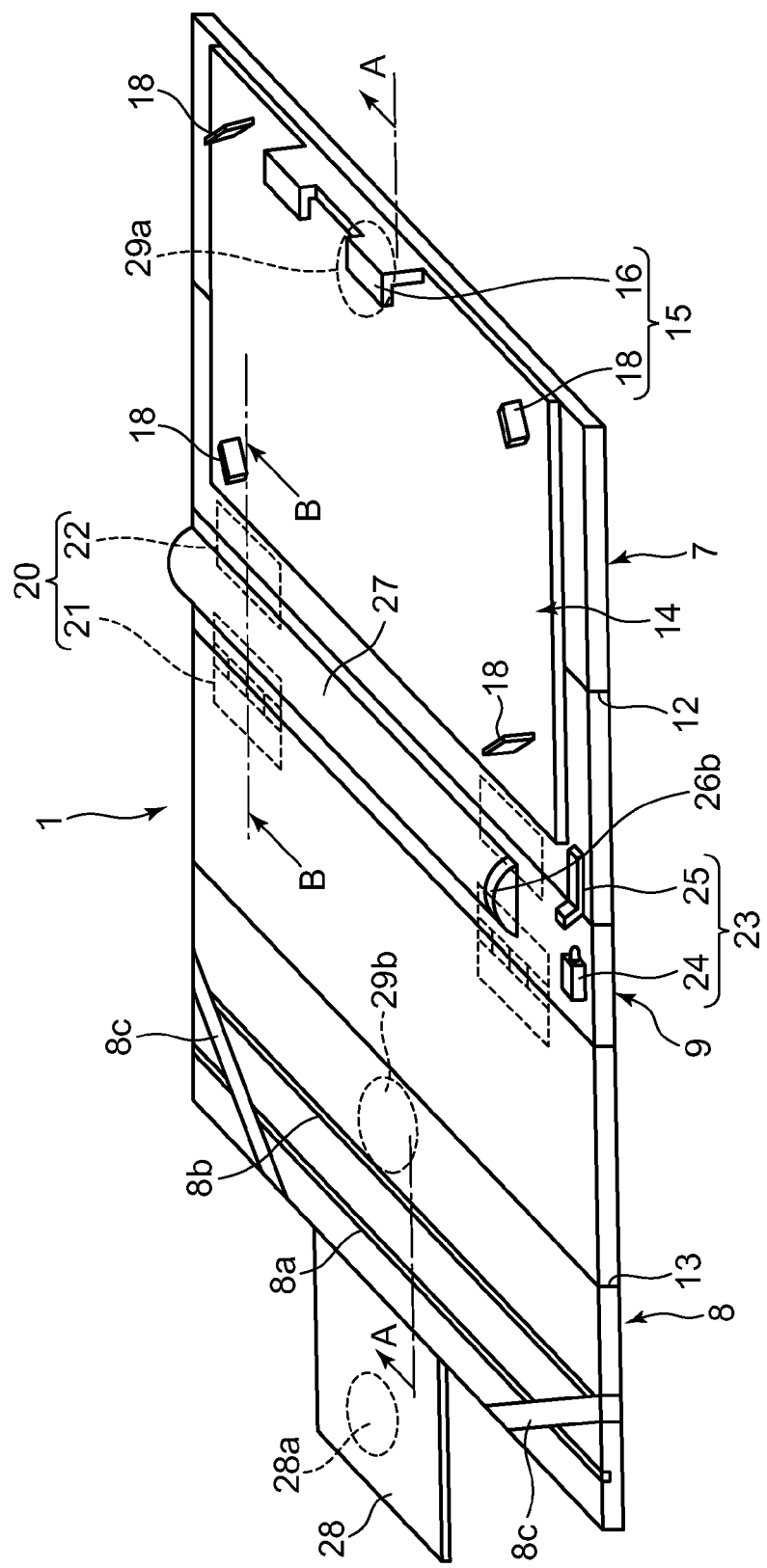
FIG. 3 is a plan view of the protective cover depicted in FIG. 2 when it is unfolded and developed.

As a result, as depicted in FIG. 3, FIG. 4A, and FIG. 4B, the protective cover 1 is structured to be foldable at a portion between the first flat section 7 and the coupling section 9 coupled together and a portion between the second flat section 8 and the coupling section 9 coupled together, via the cover sheet 11.

Here, a first folding section 12 is provided at a middle portion of the first flat section 7 in parallel with a folding direction relative to the coupling section 9, and a second folding section 13 is also provided at a middle portion of the second flat section 8 in parallel with the folding direction relative to the coupling section 9.

Accordingly, as depicted in FIG. 4A and FIG. 4B, the first flat section 7 is structured such that the intermediate plate 10 is divided into left and right sides with the first folding section 12 as a boundary, and the portions obtained by the division are coupled together such that the first flat section 7 can be folded via the cover sheet 11.

Similarly, the second flat section 8 is structured such that the intermediate plate 10 is divided into left and right sides with the second folding section 13 as a boundary, and the portions obtained by the division are coupled together such that the second flat section 8 can be folded via the cover sheet 11.

Here, as depicted in FIG. 1 to FIG. 4A and FIG. 4B, the first flat section 7 is formed to have an area slightly larger than that of the back surface 3d of the electronic device 2. The second flat section 8 is formed to have an area slightly larger than the front surface 3a of the electronic device 2 and dimensions approximately equal to those of the first flat section 7.

On a portion of the second flat section 8 located opposite to the coupling section 9 and away from the second folding section 13, a first position regulating groove 8a and a second position regulating groove 8b are provided in a manner to be a predetermined distance away from each other and in parallel with the coupling section 9. The coupling section 9 is formed to have an area slightly larger than a side surface portion of the electronic device 2.

As depicted in FIG. 2 to FIG. 4A and FIG. 4B, the first flat section 7 is provided with a device mount plate 14 where the electronic device 2 is removably mounted.

Here, the device mount plate 14 is formed to have dimensions approximately equal to the back surface 3d of the device case 3. The device mount plate 14 is mounted on only a half of the first flat section 7 located opposite to the coupling section 9 with the first folding section 12 as a boundary.

As depicted in FIG. 2 to FIG. 4A and FIG. 4B, the device mount plate 14 is provided with a position regulating hook section 15 which regulates a mount position of the electronic device 2 by being removably engaged with the electronic device 2.

The position regulating hook section 15 includes paired pinching hooks 16 which pinch the one side portion 3b of the device case 3 positioned opposite to the coupling section 9, or in other words, the one side portion 3b of the device case 3 where the imaging section 5 is positioned, and a plurality of engaging hooks 18 which removably engage with engaging sections 17 provided at four corners of the back surface 3d of the device case 3.

As depicted in FIG. 2 to FIG. 4A and FIG. 4B, the paired pinching hooks 16 are structured to abut on both side portions of the imaging section 5 and the one side portion 3b of the device case 3 when pinching the one side portion 3b of the device case 3 positioned on both sides of the imaging section 5, and thereby regulate the mount position of the device case 3 with respect to the device mount plate 14.

Figure 5:
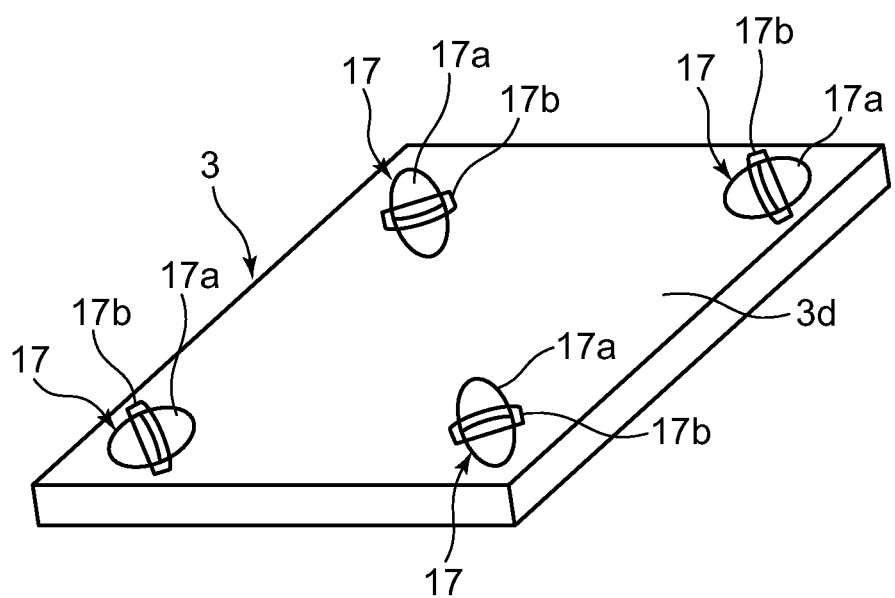
FIG. 5 is a perspective view of the back surface side of the electronic device depicted in FIG. 2.

Here, as depicted in FIG. 5, FIG. 6A, and FIG. 6B, the engaging sections 17 of the device case 3 have recesses 17a provided on four corners of the back surface 3d of the device case 3 and engaging bridge sections 17b provided in the respective recesses 17a.

Each recess 17a is formed in an approximately oval cone shape elongated from the corner of the device case 3 toward the center, and each engaging bridge section 17b is placed over an area where the oval is divided into two in a longitudinal direction.

As a result, each engaging section 17 of the device case 3 is structured such that the engaging hook 18 of the device case 3 is removably engaged with the engaging bridge section 17b, and a band (not shown) is attached to the device case 3 by being inserted in a space between the bottom of the recess 17a and the lower surface of the engaging bridge section 17b, whereby the device case 3 can be carried, as depicted in FIG. 5, FIG. 6A, and FIG. 6B.

As such, as depicted in FIG. 5, FIG. 6A, and FIG. 6B, the position regulating hook section 15 is structured such that the paired pinching hooks 16 pinch the one side portion 3b of the device case 3 where the imaging section 5 of the device case 3 is positioned so as to regulate the mount position of the device case 3 with respect to the device mount plate 14. In this state, when the device case 3 is pushed to the device mount plate 14, the engaging hooks 18 are engaged with the engaging sections 17 of the device case 3, and thereby mount the device case 3 on the device mount plate 14.

As depicted in FIG. 1 and FIG. 2, the protective cover 1 of the electronic device 2 includes a pause section 20 which regulates a closing movement of the second flat section 8 when the second flat section 8 is tilted at a predetermined angle θ with respect to the first flat section 7 so as to cover the front surface 3a of the electronic device 2.

Note that the predetermined angle θ of the second flat section 8 in association with the pause section 20 is, for example, in a range of 45 degrees to 90 degrees, and is preferably about 60 degrees.

As depicted in FIG. 3, FIG. 4A and FIG. 4B, the pause section 20 includes a first hinge 21 which rotates by a rotating force equal to or more than a predetermined rotating force and a second hinge 22 which rotates by a rotating force less than the predetermined rotating force.

The first hinge 21 is a torque hinge, and is mounted across the intermediate plate 10 of the second flat section 8 and the intermediate plate 10 of the coupling section 9.

That is, in the first hinge 21, paired mount pieces 21b are rotatably mounted on a hinge shaft 21a, as depicted in FIG. 4B. With the hinge shaft 21a being placed between the intermediate plate 10 of the second flat section 8 and the intermediate plate 10 of the coupling section 9, one of the mount pieces 21b is mounted on the intermediate plate 10 of the second flat section 8 and the other mount piece 21b is mounted on the intermediate plate 10 of the coupling section 9.

Here, as depicted in FIG. 4B, the first hinge 21 is structured such that, by a predetermined load being exerted when the paired mount pieces 21b rotate about the hinge shaft 21a, the paired mount pieces 21b rotate about the hinge shaft 21a by the rotating force equal to or more than the predetermined rotating force.

As depicted in FIG. 4B, the second hinge 22 is made of synthetic resin, and is structured such that the paired mount pieces 22b integrally coupled are foldable by a folding section 22a equivalent to a hinge shaft.

That is, the second hinge 22 is structured such that, with the folding section 22a being placed between the intermediate plate 10 of the first flat section 7 and the intermediate plate 10 of the coupling section 9, one of the mount pieces 22b is mounted on the intermediate plate 10 of the first flat section 7 and the other mount piece 22b is mounted on the intermediate plate 10 of the coupling section 9.

Here, as depicted in FIG. 4B, the folding section 22a is formed between the paired mount pieces 22b such that the thickness thereof is thinner than the thickness of each mount piece 22b.

As a result, the second hinge 22 is structured such that, when the paired mount pieces 22b rotate around the folding section 22a by the folding section 22a being folded, the paired mount pieces 22b rotate around the folding section 22a by a rotating force less than the predetermined rotating force, that is, a rotating force which rarely causes a load.

As a result, the pause section 20 is structured to, when the second flat section 8 is to cover the front surface 3a of the electronic device 2, cause the second flat section 8 to rotate together with the coupling section 9 around the second hinge 22 with respect to the first flat section 7, pause the second flat section 8 at the predetermined tilt angle θ, and then cause the second flat section 8 to rotate around the first hinge 21 with respect to the coupling section 9, as depicted in FIG. 1 to FIG. 4A and FIG. 4B.

As depicted in FIG. 1 and FIG. 2, the protective cover 1 includes a click-feeling providing section 23 which provides a click-feeling to the second flat section 8 when the second flat section 8 is paused at the predetermined tilt angle θ with respect to the first flat section 7.

Figure 7A:
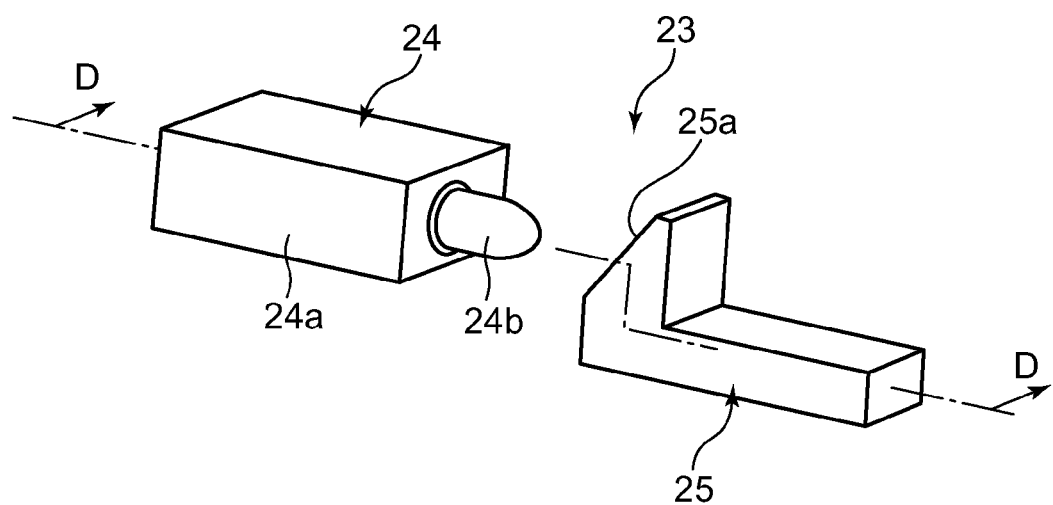
Figure 7B:
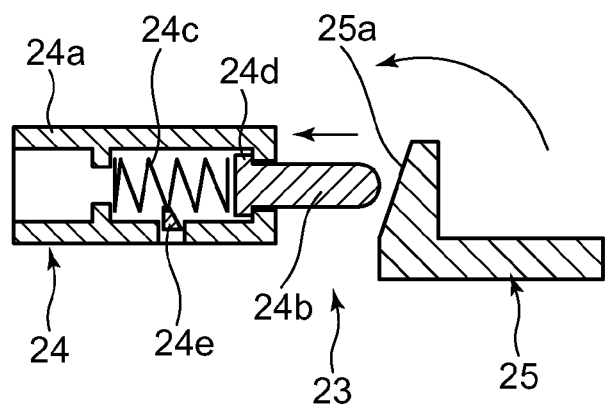

This click-feeling providing section 23 includes a click body 24 and an arm section 25, as depicted in FIG. 7A and FIG. 7B.

The click body 24 is structured such that a sliding section 24b is placed in a body section 24a provided on the coupling section 9 is retractable by the spring force of a coil spring 24c, as depicted in FIG. 7A, and FIG. 7B.

The arm section 25 is provided to the first flat section 7, and is structured such that, when the second flat section 8 rotates with the coupling section 9 at the predetermined tilt angle θ relative to the first flat section 7, a tilt section 25a at the tip pushes the sliding section 24b into the body section 24a.

Here, as depicted in FIG. 7A and FIG. 7B, the click body 24 is structured such that, when the sliding section 24b is pushed by the arm section 25 into the body section 24, a collar section 24d of the sliding section 24b overshoots a projection 24e in the body section 24a, and thereby provides a click feeling.

As depicted in FIG. 1, the protective cover 1 is structured such that an open/close angle of the protective cover 1 is detected by an open/close detecting section 26 when the protective cover 1 covers the device case 3.

This open/close detecting section 26 includes a detection element 26a provided on the device case 3, and a detection target section 26b which is provided on the protective cover 1 and can move toward or away from the detection element 26a of the device case 3 in accordance with an opening/closing movement of the protective cover 1.

The detection element 26a is a magnetic sensor such as a Hall element, and provided on a side surface inside the device case 3 corresponding to the coupling section 9 of the protective cover 1, as depicted in FIG. 1 and FIG. 2. This detection element 26a is structured to output an electric signal for causing the imaging section 5 to perform imaging as a detection signal when detecting magnetism.

The detection target section 26b is a magnet, and provided on the coupling section 9 of the protective cover 1 corresponding to the side surface of the device case 3. This detection target section 26b is structured to be able to move toward or away from the detection element 26a of the device case 3 in accordance with an opening/closing movement of the protective cover 1.

As a result, the open/close detecting section 26 is structured such that, when the second flat section 8 is tilted to the predetermined angle θ with respect to the first flat section 7 and paused, the detection element 26a detects the detection target section 26b and outputs an electric signal for causing the imaging section 5 to perform imaging as a detection signal, as depicted in FIG. 1 and FIG. 2.

Here, as depicted in FIG. 1 to FIG. 3, the coupling section 9 of the protective cover 1 corresponding to the side surface portion 3c of the device case 3 is provided with a pen holder section 27 for removably accommodating a touch pen (not shown).

This pen holder section 27 is formed in an approximately semi-cylindrical shape, and structured such that one end (upper side portion in FIG. 3) open is open.

In the pen holder section 27, the detection target section 26b of the open/close detecting section 26 is provided such that it can move toward or away from the detection element 26a of the device case 3.

As depicted in FIG. 3, a case stop section 28 is provided on one side portion of the second flat section 8 of the protective cover 1 opposite to the coupling section 9.

This case stop section 28 is formed in a flexible tongue shape, and has a flat-plate-shaped magnet 28a provided in its tip portion.

As a result, the case stop section 28 is structured to be attached to a magnetic plate 29a in the first flat section 7 when the tip portion is folded to be placed below the lower surface of the first flat section 7.

The case stop section 28 is also structured to be attached to a magnetic plate 29b in the second flat section 8 when the tip portion is folded to be placed above the upper surface of the second flat section 8.

Also, paired corner bands 8c for temporarily holding a writing paper sheet as the subject 6 are provided at corners on both sides of the side portion of the second flat section 8 opposite to the coupling section 9.

Next, the operation of the protective cover 1 is described.

First, the mounting of the electronic device 2 onto the protective cover 1 is described.

In this case, the protective cover 1 is unfolded and developed, and the back surface 3d of the device case 3 is placed corresponding to the device mount plate 14 provided on the first flat section 7 of the protective cover 1.

In this state, the device case 3 is mounted on the device mount plate 14 by the position regulating hook section 15.

Here, the one side portion 3b of the device case 3 where the imaging section 5 of the device case 3 is located is pinched between the paired pinching hooks 16 of the position regulating hook section 15, and thereby regulates the mount position of the device case 3 relative to the device mount plate 14.

In this state, by the device case 3 being pushed onto the device mount plate 14, the engaging hooks 18 are removably engaged with the engaging sections 17 of the device case 3, whereby the device case 3 is mounted on the device mount plate 14.

Then, when the electronic device 2 mounted on the protective cover 1 is to be carried, the protective cover 1 is folded at the coupling section 9 to cause the second flat section 8 to be arranged on the front surface 3a of the device case 3.

Here, firstly, the second flat section 8 and the coupling section 9 rotate around the second hinge 22 with respect to the first flat section 7. Then, when the second flat section 8 is tilted to the predetermined angle θ relative to the first flat section 7, the closing movement of the second flat section 8 is paused by the pause section 20, and the click-feeling providing section 23 provides a click feeling to the second flat section 8.

That is, when the second flat section 8 is to cover the front surface 3a of the electronic device 2, if the second flat section 8 rotates together with the coupling section 9 with respect to the first flat section 7 about the second hinge 22 rotating by the rotating force less than the predetermined rotating force, and is tilted to the predetermined angle θ relative to the first flat section 7, the rotating force of the second flat section 8 is slowed by the rotating force of the first hinge 21, and the pause section 20 pauses the rotation of the second flat section 8 and the coupling section 9 around the second hinge 22.

When the second flat section 8 is tilted to the predetermined angle θ relative to the first flat section 7, the sliding section 24b of the click body 24 is pushed by the arm section 25 provided on the first flat section 7 into the body section 24a against the spring force of the coil spring 24c, and the collar section 24d of the sliding section 24b overshoots the projection 24e in the body section 24a, whereby the click-feeling providing section 23 provides a click feeling.

Then, when the second flat section 8 is rotated by a rotating force equal to or more than the predetermined rotating force, this time, the second flat section 8 rotates around the first hinge 21 with respect to the coupling section 9.

With this, the coupling section 9 corresponds to and covers the side surface portion 3c of the device case 3, and the second flat section 8 corresponds to and covers the front surface 3a of the device case 3.

In this state, the case stop section 28 provided on the one side portion of the second flat section 8 is folded so that the tip portion thereof is placed below the lower surface of the first flat section 7.

Then, the magnet 28a in the tip of the case stop section 28 is attached to the magnetic plate 29a in the first flat section 7.

As a result, second flat section 8 is prevented from being inadvertently opened, and the electronic device 2 is favorably protected by the protective cover 1 when it is carried.

Next, use of the electronic device 2 protected by the protective cover 1 as described above is described. In this case, firstly, the case stop section 28 is detached from the lower surface of the first flat section 7 against an attachment force between the magnet 28a of the case stop section 28 provided to the one side portion of the second flat section 8 and the magnet plate 29a in the first flat section 7.

Then, the case stop section 28 is unfolded to be placed on the back surface of the second flat section 8, and the magnet 28a inside the tip portion of the case stop section 28 is attached to the magnet plate 29b in the second flat section 8.

In this state, the second flat section 8 is opened to expose the front surface 3a of the device case 3.

Here, the second flat section 8 rotates together with the coupling section 9 about the second hinge 22 to be opened at 180 degrees, and exposes the input display section 4 of the device case 3.

In this state, by the input display section 4 being touched while information displayed thereon is being viewed, display content can be switched and other information can be inputted.

Here, in a case where the electronic device 2 is operated by being held with one hand, the second flat section 8 is further rotated by 180 degrees around the second hinge 22 so as to overlap with the lower surface of the first flat section 7.

In this state, by the device case 3 and the second flat section 8 being held with one hand to be pinched and the input display section 4 of the device case 3 being touched, the electronic device 2 can be favorably used.

Figure 8A:
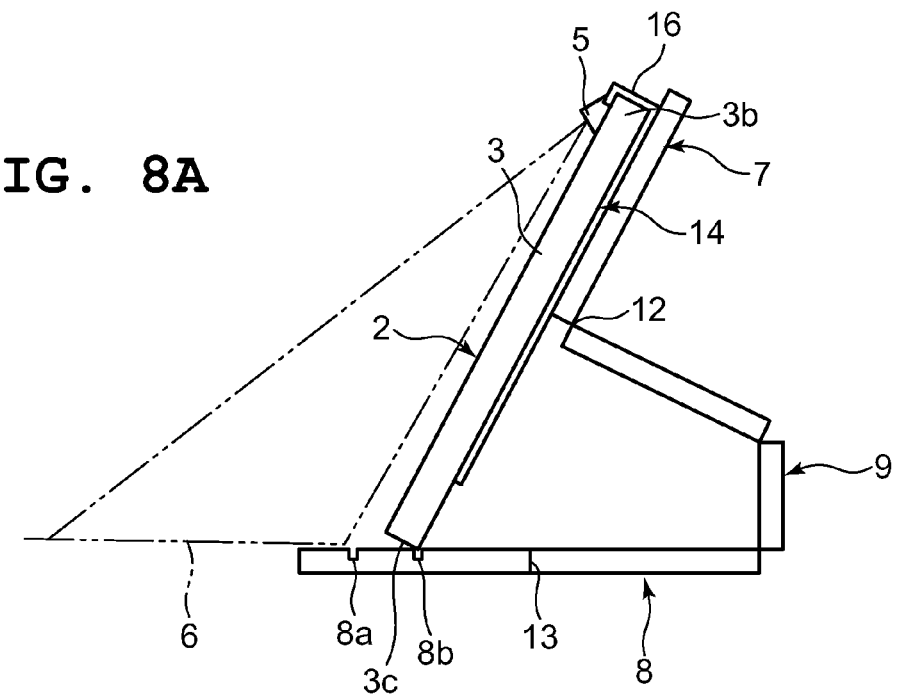

In a case where the electronic device 2 is leaned against the protective cover 1 and used, the protective cover 1 is first unfolded and developed on a plane, and the first flat section 7 is rotated around the second hinge 22 with respect to the second flat section 8 so as to stand upright, as depicted in FIG. 8A.

Then, the standing first flat section 7 is folded at the first folding section 12 so as to project toward the rear of the device case 3. As a result, the imaging section 5 of the device case 3 is positioned above, and the side surface portion 3c below the device case 3 positioned opposite thereto is placed above the second flat section 8. In this state, the device case 3 is diagonally tilted to be leaned against the protective cover 1.

Here, an edge of the side surface portion 3c positioned below the device case 3 is engaged with either one of the first position regulating groove 8a and the second position regulating groove 8b provided on the second flat section 8 selectively, whereby the tilt angle of the device case 3 is adjusted.

For example, when the edge of the side surface portion 3c positioned below the device case 3 is engaged with the first position regulating groove 8a of the second flat section 8, the tilt of the device case 3 is slight.

Also, when the edge of the side surface portion 3c positioned below the device case 3 is engaged with the second position regulating groove 8b of the second flat section 8, the tilt of the device case 3 is steep.

Moreover, when the edge of the side surface portion 3c positioned below the device case 3 is placed on the upper surface of the second flat section 8 positioned on the coupling section 9 side of the second position regulating groove 8b, the device case 3 is leaned at a steeper angle.

Figure 8B:
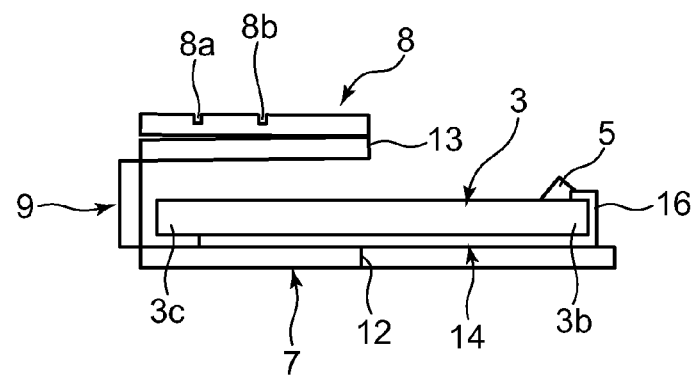

In a case where a memo is required to be written on a recording paper sheet such as a writing paper sheet as the subject 6 while the electronic device 2 is being held with one hand, the second flat section 8 is folded at the second folding section 13 with the device case 3 being covered and protected by the protective cover 1, as depicted in FIG. 8B.

Then, the second flat section 8 is folded into two, and the folded portions are overlapped with each other. In this state, the electronic device 2 is held with one hand together with the protective cover 1, and the recording paper sheet such as a writing paper sheet is placed on the uppermost surface of the overlapping portions of the second flat section 8. As a result, a memo can be written.

Figure 8C:
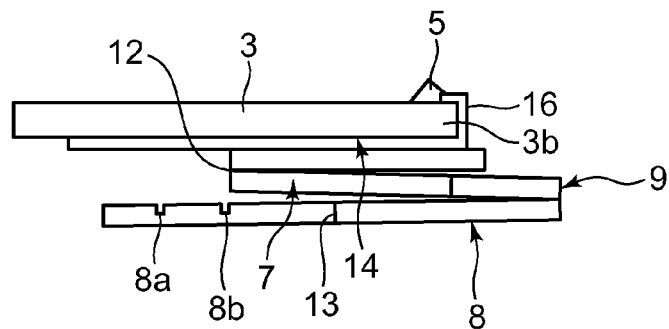

Also, in a case where a touch operation is required to be performed on the input display section 4 while a recording paper sheet containing a memo is being viewed, the protective cover 1 is once unfolded and developed on a plane. In this state, the first flat section 7 is rotated around the second hinge 22, and folded at the first folding section 12 downward relative to the device case 3, and the folded portions are overlapped with each other, as depicted in FIG. 8C.

Then, since the second flat section 8 is overlapped below the device case 3, a recording paper sheet is interposed between the second flat section 8 and a half of the first flat section 7 folded and positioned below, and partially projected from the device case 3. Accordingly, a touch operation can be performed on the input display section 4 of the device case 3 while the memo written in the projected recording paper sheet is being viewed.

Next, imaging of the subject 6, such as a memo or a business card recorded on a recording paper sheet, by the imaging section 5 is described.

Firstly, in a state where the device case 3 is mounted on the device mount plate 14 on the first flat section 7 of the protective cover 1, the electronic device 2 is set at an imaging mode so that imaging by the imaging section 5 can be performed.

Then, the protective cover 1 is unfolded and developed on a plane, and the subject 6 is placed on the second flat section 8 of the developed protective cover 1. Here, the subject 6 is fixed by being inserted below the corner bands 80c of the second flat section 8.

In this state, as depicted in FIG. 1, the second flat section 8 is rotated together with the coupling section 9 around the second hinge 22 so as to be tilted toward the front surface 3a of the device case 3.

Here, the second flat section 8 rotates around the second hinge 22 and, when the second flat section 8 is tilted to the predetermined angle θ with respect to the first flat section 7, the closing movement of the second flat section 8 is paused by the pause section 20, and the click-feeling providing section 23 provides a click feeling to the second flat section 8.

Here, the open/close detecting section 26 detects an open/close angle of the second flat section 8.

That is, in the open/close detecting section 26, when the second flat section 8 is tilted to the predetermined angle θ with respect to the first flat section 7, the detection target section 26b that is the magnet provided in the protective cover 1, is brought closer to the detection element 26a that is the magnetic sensor such as a Hall element provided in the device case 3, and the detection element 26a detects a magnetic field of the detection target section 26b and outputs an electric signal for causing the imaging section 5 to perform imaging.

As a result, the subject 6 such as the recording paper sheet containing a memo or a business card is imaged by the imaging section 5.

Note that the present invention is not limited thereto, and the subject 6 can be imaged even when, for example, the electronic device 2 is leaned against the protective cover 1.

In this case, as depicted in FIG. 8A, the first flat section 7 is rotated around the first hinge 21 to stand upright, and the standing first flat section 7 is folded at the first folding section 12 so as to project toward the rear of the device case 3.

With this, as depicted in FIG. 8A, the device case 3 is diagonally tilted and leaned against the protective cover 1.

In this state, the subject 6 such as a recording paper sheet containing a memo or a business card is placed in front of the electronic device 2, and a switch for imaging (not shown) is turned ON. As a result, the subject 6 can be imaged by the imaging section 5.

As such, the electronic device of the present embodiment is provided with the first flat section 7 where the back surface 34 of the flat-type electronic device 2 is placed, the second flat section 8 which openably and closably covers the front surface 3a of the electronic device 2, and the coupling section 9 which foldably couples the first flat section 7 and the second flat section 8 together. The first flat section 7 is provided with the first folding section 12 in parallel with the coupling section 9 and the second flat section 8 is provided with the second folding section 13 in parallel with the coupling section 9. As a result of this structure, the electronic device which is user-friendly and can be used according to various use situations is provided.

That is, in the electronic device of the present embodiment, the front surface 3a of the electronic device 2 placed on the first flat section 7 can be openably and closably covered by the second flat section 8. Also, the first folding section 12 of the first flat section 7 and the second folding section 13 of the second flat section 8 can be selectively folded in accordance with the use state of the electronic device 2. As a result of this structure, the electronic device which is user-friendly and can be used according to various use situations is provided.

For example, in a case where the electronic device 2 is held with one hand for operation, the second flat section 8 is rotated around the second hinge 22 of the coupling section 9 and overlapped with the lower surface of the first flat section 7. As a result, the input display section 4 of the device case 3 can be touched with the device case 3 and the second flat section 8 being pinched with one hand, and the device can be used favorably.

In a case where the electronic device 2 is leaned against the protective cover 1 and used, with the protective cover 1 being unfolded and developed on a plane, the first flat section 7 is rotated with respect to the second flat section 8 about the second hinge 22 of the coupling section 9 so as to stand upright, and the standing first flat section 7 is folded at the first folding section 12 to project toward the rear of the device case 3. As a result, the imaging section 5 of the device case 3 is positioned above, and the side surface portion 3c below the device case 3 positioned opposite thereto is placed on the second flat section 8. Accordingly, the device case 3 can be used with it being tilted and leaned against the protective cover 1 for use.

In this case, the second flat section 8 is provided with the first position regulating groove 8a and the second position regulating groove 8b which engage with the edge of the side surface portion 3c positioned below the device case 3. Therefore, by engaging the edge of the side surface portion 3c positioned below the device case 3 with one of the first position regulating groove 8a and the second position regulating groove 8b selectively, the tilt angle of the device case 3 can be adjusted in accordance with a use situation.

For example, when the edge of the side surface portion 3c positioned below the device case 3 is engaged with the first position regulating groove 8a of the second flat section 8, the tilt of the device case 3 is slight.

When the edge of the side surface portion 3c positioned below the device case 3 is engaged with the second position regulating groove 8b of the second flat section 8, the tilt of the device case 3 is steep.

Moreover, when the edge of the side surface portion 3c positioned below the device case 3 is placed on the upper surface of the second flat section 8 positioned on the coupling section 9 side of the second position regulating groove 8b, the device case 3 is leaned at a steeper angle.

In a case where a memo is required to be written on a recording paper sheet such as a writing paper sheet as the subject 6 while the electronic device 2 is being held with one hand, the second flat section 8 is folded at the second folding section 13 with the device case 3 being covered and protected by the protective cover 1.

Then, the second flat section 8 is folded into two, and the folded portions are overlapped with each other.

In this state, the electronic device 2 is held with one hand together with the protective cover 1, and the recording paper sheet such as a writing paper sheet is placed on the uppermost surface of the overlapping portions of the second flat section 8. As a result, a memo can be written.

Also, in a case where a touch operation is required to be performed on the input display section 4 while a recording paper sheet containing a memo is being viewed, with the protective cover 1 being unfolded and developed on a plane, the first flat section 7 is rotated around the second hinge 22 of the coupling section 9, and folded at the first folding section 12 downward relative to the device case 3, and the folded portions are overlapped with each other. Then, a recording paper sheet is interposed between a half of the first flat section 7 folded and positioned below and the second flat section 8, and thereby partially projects from the device case 3. As a result, the input display section 4 of the device case 3 can be touched while the memo written on the projected recording paper sheet is being viewed.

Also, in the electronic device of the present embodiment, the first flat section 7 is provided with the device mount plate 14 for removably mounting the electronic device 2 on the first flat section 7. Accordingly, although the first flat section 7 has the first folding section 12 provided therein, the electronic device 2 can be reliably and favorably mounted on the first flat section 7 by the device mount plate 14 in a stable state.

In this case, the device mount plate 14 is provided with the position regulating hook section 15 with which the electronic device 2 is removably engaged and which regulates the mount position of the electronic device 2. Accordingly, when the electronic device 2 is to be mounted on the device mount plate 14, it can be reliably and favorably mounted on the device mount plate 14 by accurate positional regulation by the position regulating hook section 15.

This position regulating hook sections 15 includes the paired pinching hooks 16 which pinch the side surface portion 3b of the electronic device 2 positioned opposite to the coupling section 9 of the protective cover 1, and the engaging hook 18 which removably engages with the engaging section 17 provided at each of four corners of the back surface 3d of the electronic device 2. Accordingly, the electronic device 2 can be simply and easily mounted on the device mount plate 14.

That is, with the position regulating hook section 15, the mount position of the device case 3 with respect to the device mount plate 14 can be accurately and reliably regulated by the one side portion 3b of the device case 3 where the imaging section 5 is positioned in the device case 3 of the electronic device 2 being pinched by the paired pinching hooks 16 of the position regulating hook section 15. In this state, by the device case 3 being pushed onto the device mount plate 14, the engaging hook 18 can be reliably engaged with the engaging section 17 of the device case 3, whereby the device case 3 can be reliably and favorably mounted on the device mount plate 14.

In this case, the engaging section 17 of the electronic device 2 includes the recess 17a provided at each of the four corners of the back surface 3d of the device case 3 of the electronic device 2, and the engaging bridge section 17b provided in the recess 17a. Accordingly, only by the device case 3 being pushed onto the device mount plate 14, the engaging hook 18 can be easily and reliably engaged with the engaging bridge section 17b of the engaging section 17. In addition, the band (not shown) can be inserted between the bottom of the recess 17a and the lower surface of the engaging bridge section 17b for mounting on the device case 3, by which the device case 3 can be carried.

Furthermore, in the electronic device of the present embodiment, the second flat section 8 can be paused by the pause section 20 at the predetermined tilt angle θ when the front surface 3a of the electronic device 2 placed on the first flat section 7 is covered by the second flat section 8. Therefore, imaging timing of the imaging section 5 of the electronic device 2 can be ensured. As a result, the subject 6 such as a recording paper sheet or business card placed on the second flat section 8 can be accurately and favorably imaged always in a predetermined state.

Thus, in the electronic device of the present embodiment, when the second flat section 8 is tilted to the predetermined angle θ with respect to the first flat section 7 and the rotation of the second flat section 8 is paused by the pause section 20, the open/close detecting section 26 detects an open/close angle of the second flat section 8 with respect to the first flat section 7 and outputs a detection signal for causing the imaging section 5 to perform imaging. Therefore, imaging timing of the imaging section 5 can be kept constant. In addition, the pause of the second flat section 8 generates sufficient imaging timing, whereby the subject 6 can be reliably and favorably imaged.

Second Embodiment

Next, a second embodiment in which the present invention has been applied to an electronic device is described with reference to FIG. 9 to FIG. 12.

Note that components identical to those of the first embodiment depicted in FIG. 1 to FIG. 8C are provided with the same reference numerals.

Figure 9:
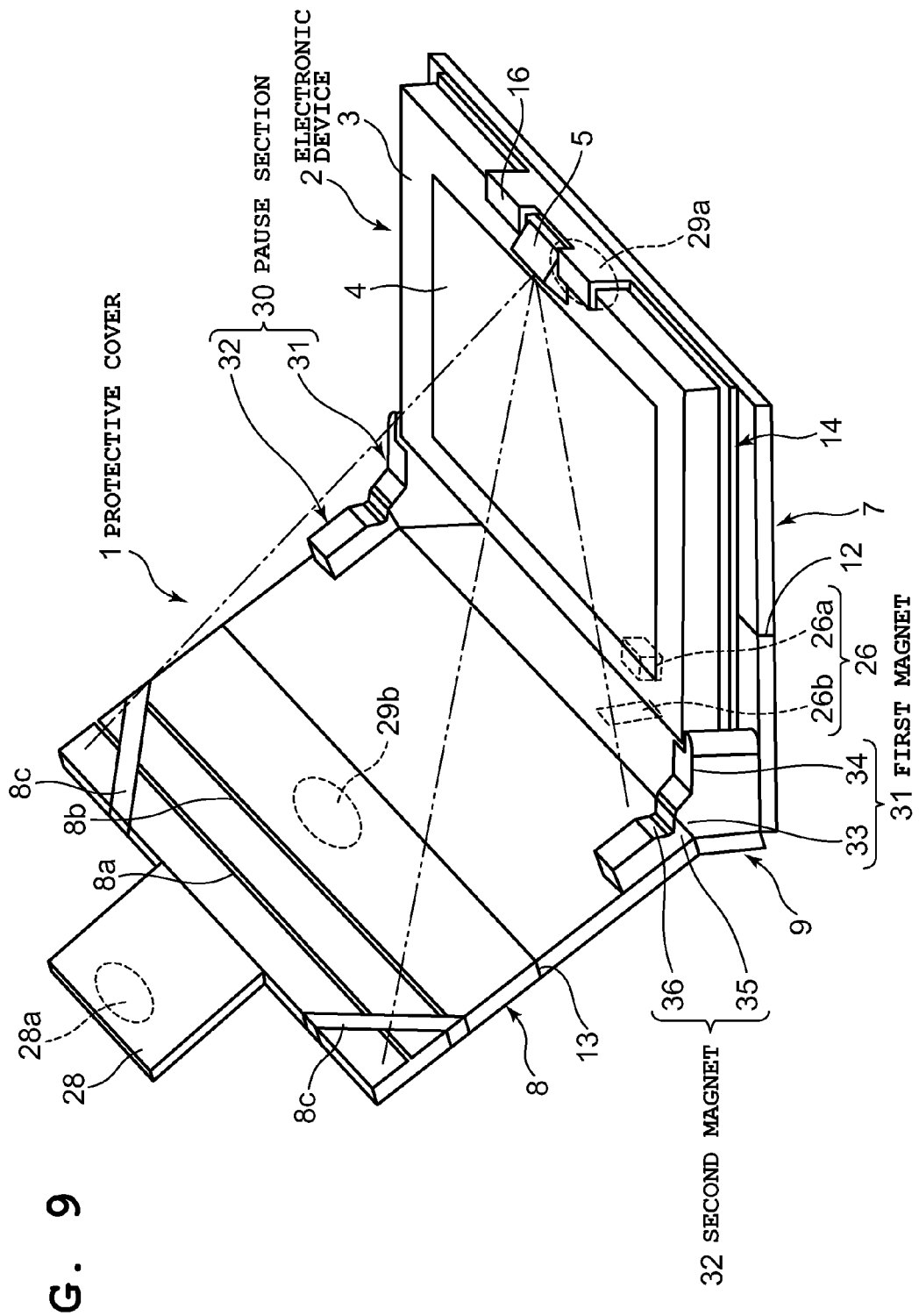
FIG. 9 is a perspective view of a second embodiment in use, in which the present invention has been applied to an electronic device.
Figure 10:
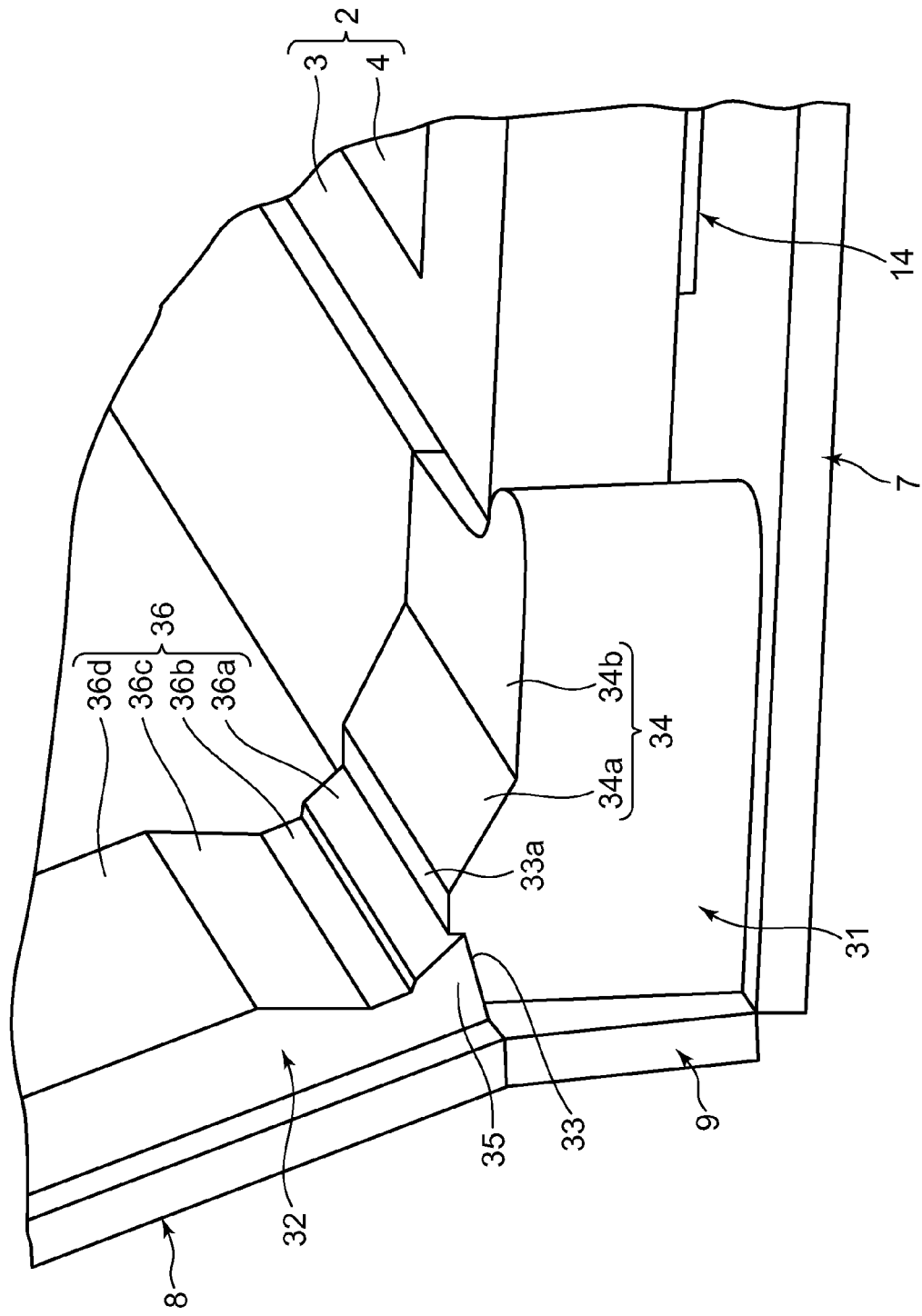
FIG. 10 is an enlarged perspective view of the main portion of a pause section of the protective cover depicted in FIG. 9.
Figure 11:
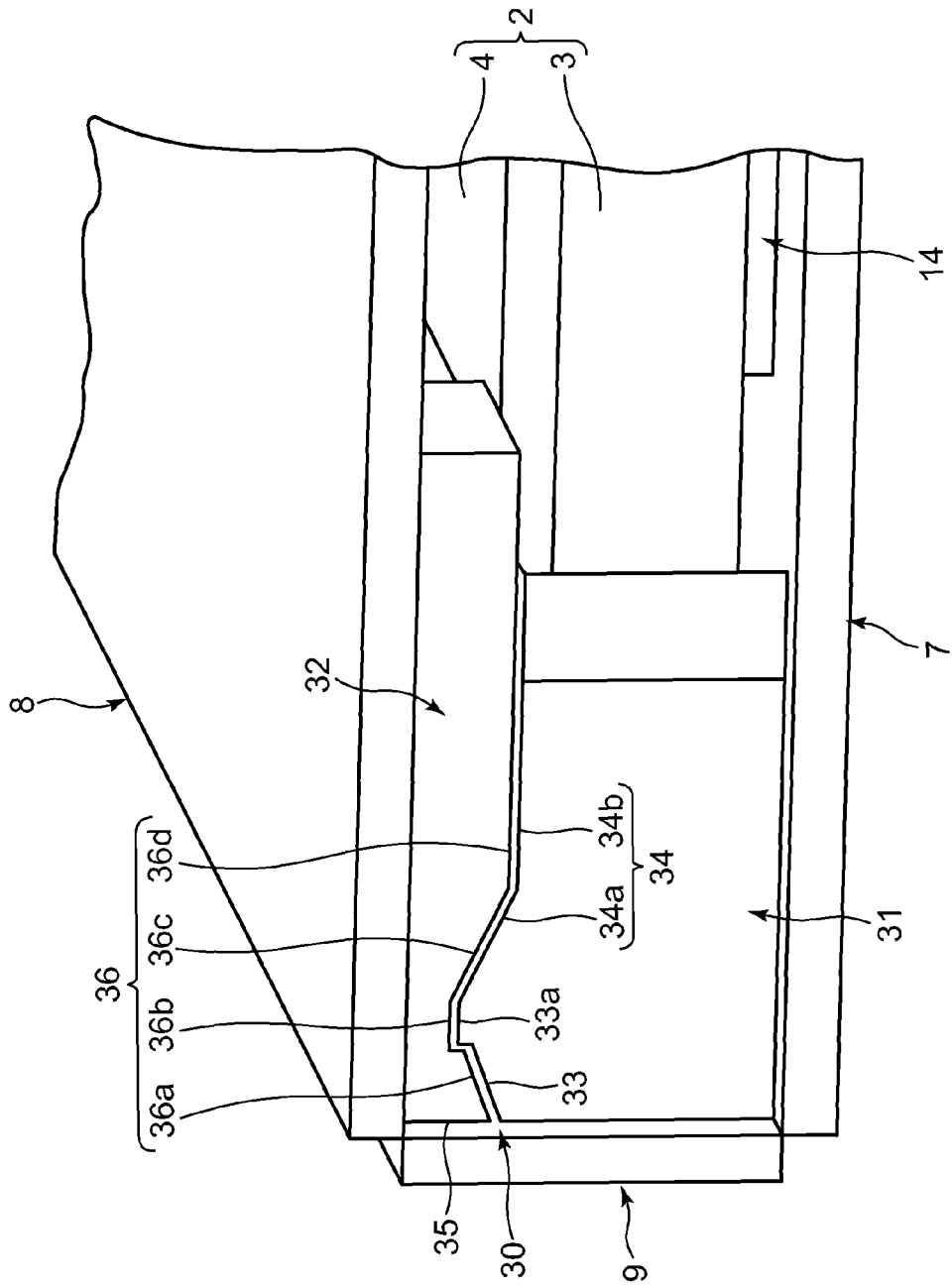
FIG. 11 is an enlarged perspective view of the main portion of the pause section when the front surface of the device case is covered and closed by a second flat section of the protective cover depicted in FIG. 10.

As depicted in FIG. 9 to FIG. 11, the protective cover 1 includes a pause section 30 structured differently from the first embodiment. Except for this point, the protective cover 1 is approximately identical in structure to that of the first embodiment.

That is, as depicted in FIG. 9 to FIG. 11, the pause section 30 is structured to include a first magnet 31 provided to the first flat section 7 positioned on one side portion of the coupling section 9 of the protective cover 1 and a second magnet 32 provided to the second flat section 8 positioned on the other side portion of the coupling section 9. By the first magnet 31 and the second magnet 32 being attached to each other by magnetic force, the second flat section 8 is protected in a predetermined state with respect to the first flat section 7.

In this case, the first flat section 7 and the coupling section 9 are coupled together via the cover sheet 11 covering the intermediate plate 10 of the first flat section 7 and the intermediate plate 10 of the coupling section 9. By this cover sheet 11 being folded, the first flat section 7 and the coupling section 9 can be freely folded.

Also, the second flat section 8 and the coupling section 9 are coupled together via the cover sheet 11 covering the intermediate plate 10 of the second flat section 8 and the intermediate plate 10 of the coupling section 9. By this cover sheet 11 being folded, the second flat section 8 and the coupling section 9 can be freely folded.

The first magnet 31 of the pause section 30 includes a first tilt section 33 for tilting and holding the second flat section 8 at the predetermined angle θ with respect to the first flat section 7, and a second tilt section 34 which positionally regulates the second flat section 8 when the second flat section 8 covers and closes the front surface 3a of the device case 3, as depicted in FIG. 9 to FIG. 11.

In this case, the thickness of the first magnet 31 is formed to have a height lower than the width of the coupling section 9, or in other words, a height approximately equal to the thickness of the device case 3, as depicted in FIG. 9 to FIG. 11.

The first tilt section 33 of the first magnet 31 is formed to be tilted upward to the right from the end of the first magnet 31 positioned on the coupling section 9 side toward the device case 3 side. On the upper portion of the first tilt section 33, a projection 33a for regulating the position of the second magnet 32 is formed.

The second tilt section 34 of the first magnet 31 includes a tilt section 34a tilted downward to the right from the upper end of the first tilt section 33 toward the device case 3 side, and a flat section 34b flatly extending from the tilt section 34a toward the device case 3 side, as depicted in FIG. 9 to FIG. 11. The tilt section 34a and flat section 34b are formed in a row on the upper portion of the first magnet 31.

On the other hand, the second magnet 32 includes a third tilt section 35 for tilting and holding the second flat section 8 at the predetermined angle θ with respect to the first flat section 7 by being attached to the first tilt section 33 of the first magnet 31, and a fourth tilt section 36 which positionally regulates the second flat section 8 by being attached to the second tilt section 34 of the first magnet 31 when the second flat section 8 covers and closes the front surface 3a of the device case 3, as depicted in FIG. 9 to FIG. 11.

In this case, as depicted in FIG. 9 to FIG. 11, the second magnet 32 is formed to have a thin thickness so that, when the second flat section 8 covers the front surface 3a of the device case 3 and overlaps with the first magnet 31, both thicknesses are slightly higher than the width of the coupling section 9, or in other words, the thickness of the device case 3.

The third tilt section 35 of the second magnet 32 is an end face of the second magnet 32 positioned on the coupling section 9 side, and is structured to tilt and hold the second flat section 8 at the predetermined angle θ with respect to the first flat section 7 when it is attached onto the first tilt section 33 of the first magnet 31.

The fourth tilt section 36 of the second magnet 32 includes a rising tilt section 36a tilted upward to the right from the upper end of the third tilt section 35 toward the side opposite to the coupling section 9, a groove section 36b positioned on the upper portion of the rising tilt section 36a, a falling tilt section 36c tilted downward to the right from the groove section 36b toward the side opposite to the coupling section 9, and a flat section 36d flatly extending from the falling tilt section 36c toward the side opposite to the coupling section 9, as depicted in FIG. 11. The rising tilt section 36a, the groove section 36b, the falling tilt section 36c, and the flat section 36d are formed in a row on the upper portion of the second magnet 32.

That is, when the second flat section 8 covers and closes the front surface 3a of the device case 3, the rising tilt section 36a corresponds to and is attached to the first tilt section 33, the groove section 36b corresponds to and is attached to the projection 33a of the first tilt section 33, the falling tilt section 36c corresponds to and is attached to the tilt section 34a of the second tilt section 34, and the flat section 36d corresponds to and is attached to the flat section 34b of the second tilt section 34, whereby the fourth tilt section 36 regulates the position of the second magnet 32 with respect to the first magnet 31 in the front and back direction of the device case 3 (a horizontal direction in FIG. 11), as depicted in FIG. 11.

Next, the operation of the protective cover 1 is described.

First, in a case where the electronic device 2 is mounted on the protective cover 1 so as to be carried, the second flat section 8 is folded at the coupling section 9 and thereby placed on the front surface 3a of the device case 3.

Here, the protective cover 1 is folded between the first flat section 7 and the coupling section 9 and between the second flat section 8 and the coupling section 9, whereby the closing movement of the second flat section 8 is paused by the pause section 30, and the second flat section 8 is held with the second flat section 8 being tilted at the predetermined angle θ with respect to the first flat section 7.

That is, when the protective cover 1 is folded between the first flat section 7 and the coupling section 9 and between the second flat section 8 and the coupling section 9, the second magnet 32 of the second flat section 8 serving as the pause section 30 is brought closer to the first magnet 31 of the first flat section 7, and the third tilt section 35 of the second magnet 32 corresponds to and is attached to the first tilt section 33 of the first magnet 31, whereby the second flat section 8 is held at the predetermined angle δ with respect to the first flat section 7.

Here, a corner of the third tilt section 35 of the second magnet 32 abuts on the projection 33a on the upper portion of the first tilt section 33 of the first magnet 31 for positional regulation. Therefore, the third tilt section 35 of the second magnet 32 can be attached to a predetermined position of the first tilt section 33 of the first magnet 31, whereby the second flat section 8 can be tilted and held at the predetermined position and at the predetermined angle θ.

Then, when the second flat section 8 is rotated against the attachment force between the first magnet 31 and the second magnet 32, rotation is made with the corner of the third tilt section 35 of the second magnet 32 serving as a pivot and abutting on the projection 33a on the upper portion of the first tilt section 33 of the first magnet 31, and the fourth tilt section 36 of the second magnet 32 corresponds to the first tilt section 33 and the second tilt section 34 of the first magnet 31.

Then, when the second flat section 8 corresponds to and covers the front surface 3a of the device case 3, the rising tilt section 36a of the fourth tilt section 36 of the second magnet 32 corresponds to and is attached to the first tilt section 33, the groove section 36b of the fourth tilt section 36 corresponds to and is attached to the projection 33a of the first tilt section 33, the falling tilt section 36c of the fourth tilt section 36 corresponds to and is attached to the tilt section 34a of the second tilt section 34, and the flat section 36d of the fourth tilt section 36 corresponds to and is attached to the flat section 34b of the second tilt section 34.

As a result, the second magnet 32 is reliably and positionally regulated with respect to the first magnet 31 without a positional shift to the front and back direction of the device case 3 (horizontal direction in FIG. 11), whereby the second flat section 8 reliably corresponds to and covers the front surface 3a of the device case 3 so that the closed state is kept.

Thus, by the attachment force by the magnetic force between the first magnet 31 and the second magnet 32, the second flat section 8 is prevented from being inadvertently opened.

Next, use of the electronic device 2 protected by the protective cover 1 is described. In this case, firstly, the second flat section 8 is opened to expose the front surface 3a of the device case 3.

Here, when the second flat section 8 is rotated against the attachment force by the magnetic force between the first magnet 31 and the second magnet 32 of the pause section 30, the second magnet 32 rotates with respect to the first magnet 31 with the corner of the third tilt section 35 of the second magnet 32 as a pivot.

Then, the portion between the second flat section 8 and the coupling section 9 is folded, and thereby the second flat section 8 is rotated and opened.

Then, the portion between the first flat section 7 and the coupling section 9 is folded. As a result, the second flat section 8 is rotated by 180 degrees and opened to be in a developed state, whereby the input display section 4 of the device case 3 is exposed.

In this state, by the input display section 4 being touched while information displayed thereon being viewed, display contents can be switched and other information can be inputted.

Here, in a case where the electronic device 2 is operated by being held with one hand, either one of the portion between the first flat section 7 and the coupling section 9 and the portion between the second flat section 8 and the coupling section 9 is folded to further rotate the second flat section 8 by 180 degrees and overlaps it with the lower surface of the first flat section 7.

In this state, the device case 3 and the second flat section 8 are held with one hand to be pinched, and the input display section 4 of the device case 3 is touched, whereby the electronic device 2 can be favorably used.

Figure 12:
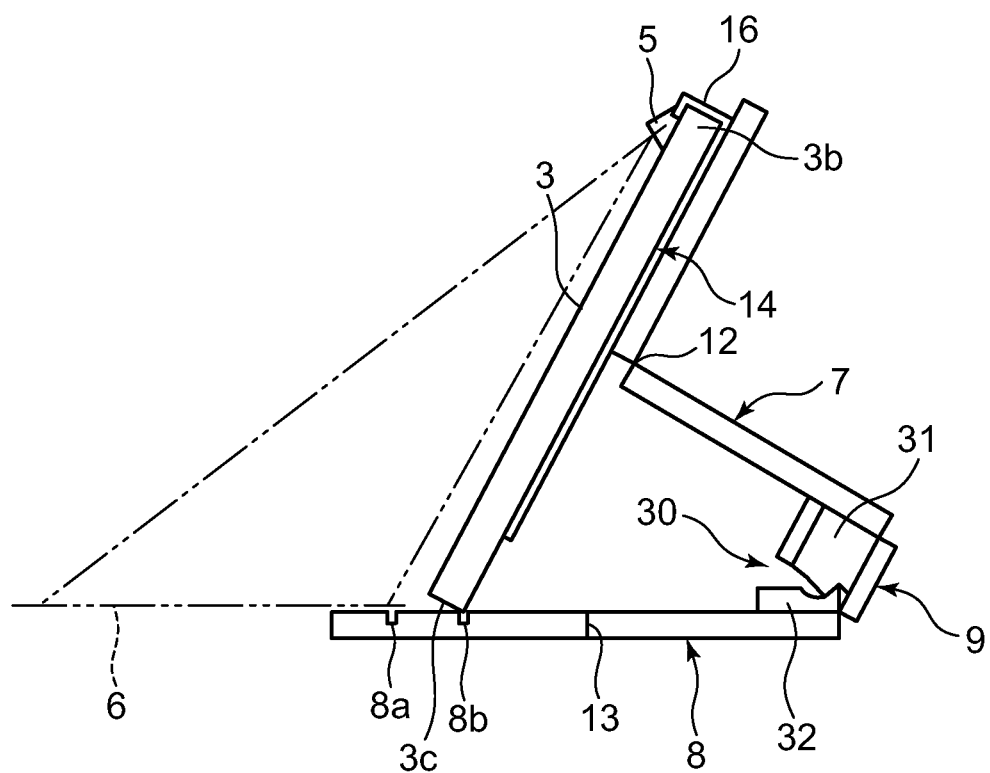
FIG. 12 is a side view depicting the state in which the electronic device is used by being leaned against the protective cover depicted in FIG. 9.

In a case where the electronic device 2 is leaned against the protective cover 1 to use, the protective cover 1 is first unfolded and developed on a plane. Then, in this state, the portion between the first flat section 7 and the coupling section 9 is folded to rotate the first flat section 7 with respect to the second flat section 8 and cause the first flat section 7 to stand upright, as depicted in FIG. 12.

Here, the first tilt section 33 of the first magnet 31 corresponds to and is attached to the rising tilt section 36a of the fourth tilt section 36 of the second magnet 32, and the projection 33a of the first tilt section 33 of the first magnet 31 corresponds to and is attached to the groove section 36b of the fourth tilt section 36 of the second magnet 32.

As a result, by the attachment force by the magnetic force between the first magnet 31 and the second magnet 32, the first flat section 7 can be held upright with respect to the second flat section 8.

Then, the standing first flat section 7 is folded at the first folding section 12 to project toward the rear of the device case 3. Then, the imaging section 5 of the device case 3 is positioned above, and the side surface portion 3c below the device case 3 positioned opposite thereto is placed on the second flat section 8. In this state, the device case 3 is tilted to be leaned against the protective cover 1.

Here, the edge of the side surface portion 3c positioned below the device case 3 is engaged with either one of the first position regulating groove 8a and the second position regulating groove 8b provided on the second flat section 8 selectively, whereby the tilt angle of the device case 3 is adjusted, as in the case of the first embodiment.

For example, when the edge of the side surface portion 3c positioned below the device case 3 is engaged with the first position regulating groove 8a of the second flat section 8, the tilt of the device case 3 is slight.

When the edge of the side surface portion 3c positioned below the device case 3 is engaged with the second position regulating groove 8b of the second flat section 8, the tilt of the device case 3 is steep.

Moreover, when the edge of the side surface portion 3c positioned below the device case 3 is placed on the upper surface of the second flat section 8 positioned on the coupling section 9 side of the second position regulating groove 8b, the device case 3 can be leaned at a steeper angle.

In a case where a memo is required to be written on a recording paper sheet such as a writing paper sheet as the subject 6 while the electronic device 2 is being held with one hand, the second flat section 8 is folded at the second folding section 13 with the device case 3 being covered and protected by the protective cover 1, as with the first embodiment. Then, the second flat section 8 is folded into two, and the folded portions are overlapped with each other.

In this state, the electronic device 2 is held with one hand together with the protective cover 1, and the recording paper sheet such as a writing paper sheet is placed on the uppermost surface of the overlapping portions of the second flat section 8. As a result, a memo can be written.

Also, in a case where a touch operation is required to be performed on the input display section 4 while a recording paper sheet containing a memo is being viewed, the protective cover 1 is once unfolded and developed on a plane. In this state, the portion between the first flat section 7 and the coupling section 9 is folded to rotate the first flat section 7, the first flat section 7 is folded at the first folding section 12 downward relative to the device case 3, and the folded portions are overlapped with each other, as in the case of the first embodiment.

Then, since the second flat section 8 is overlapped below the device case 3, a recording paper sheet is interposed between the second flat section 8 and a half of the first flat section 7 folded and positioned below, and partially projected from the device case 3, as in the case of the first embodiment. Accordingly, a touch operation can be performed on the input display section 4 of the device case 3 while the memo written in the projected recording paper sheet is being viewed.

Next, imaging of the subject 6, such as a memo or a business card recorded on a recording paper sheet, by the imaging section 5 is described.

Firstly, in a state where the device case 3 is mounted on the device mount plate 14 on the first flat section 7 of the protective cover 1, the electronic device 2 is set at an imaging mode so that imaging by the imaging section 5 can be performed.

Then, the protective cover 1 is unfolded and developed on a plane, and the subject 6 is placed on the second flat section 8 of the developed protective cover 1. Here, the subject 6 is fixed by being inserted below the corner bands 8c of the second flat section 8.

In this state, as depicted in FIG. 9, the portion between the first flat section 7 and the coupling section 9 and the portion between the second flat section 8 and the coupling section 9 are folded to tilt the second flat section 8 together with the coupling section 9 toward the front surface 3a of the device case 3.

Then, the second magnet 32 of the second flat section 8 as the pause section 30 is brought closer to the first magnet 31 of the first flat section 7, and the third tilt section 35 of the second magnet 32 corresponds to and is attached to the first tilt section 33 of the first magnet 31 to hold the second flat section 8 with it tilted at the predetermined angle θ with respect to the first flat section 7.

Here, the corner of the third tilt section 35 of the second magnet 32 abuts on the projection 33a positioned on the upper portion of the first tilt section 33 of the first magnet 31 for positional regulation. Therefore, the third tilt section 35 of the second magnet 32 can be attached to the predetermined position of the first tilt section 33 of the first magnet 31, whereby the second flat section 8 can be tilted and held at the predetermined position and at the predetermined angle θ.

Then, the open/close detecting section 26 detects an open/close angle of the second flat section 8.

That is, in the open/close detecting section 26, when second flat section 8 is tilted to the predetermined angle θ with respect to the first flat section 7, the detection target section 26b that is the magnet provided in the protective cover 1 is brought closer to the detection element 26a that is the magnetic sensor such as a Hall element provided in the device case 3, and the detection element 26a detects a magnetic field of the detection target section 26b and outputs an electric signal for causing the imaging section 5 to perform imaging.

As a result, the subject 6 such as the recording paper sheet containing a memo or a business card is imaged by the imaging section 5.

Note that the present invention is not limited thereto, and the subject 6 can be imaged even when, for example, the electronic device 2 is leaned against the protective cover 1.

In this case, as depicted in FIG. 12, the portion between the second flat section 8 and the coupling section 9 is folded to rotate the first flat section 7 and cause the first flat section 7 to stand upright.

Here, the first tilt section 33 of the first magnet 31 corresponds to and is attached to the rising tilt section 36a of the fourth tilt section 36 of the second magnet 32, and the projection 33a of the first tilt section 33 of the first magnet 31 corresponds to and is attached to the groove section 36b of the fourth tilt section 36 of the second magnet 32.

As a result, by the attachment force by the magnetic force between the first magnet 31 and the second magnet 32, the first flat section 7 can be held upright with respect to the second flat section 8.

By folding this standing first flat section 7 at the first folding section 12 to project toward the rear of the device case 3, the device case 3 is tilted against the protective cover 1, as depicted in FIG. 12.

In this state, the subject 6 such as a recording paper sheet or business card containing a memo is placed in front of the electronic device 2, and a switch for imaging (not shown) is turned ON. As a result, the subject 6 can be imaged by the imaging section 6.

As such, in the electronic device of the second embodiment as well, the front surface 3a of the electronic device 2 placed on the first flat section 7 can be openably and closably covered by the second flat section 8, and the first folding section 12 of the first flat section 7 and the second folding section 13 of the second flat section 8 can be selectively folded in accordance with the use state of the electronic device 2, as in the case of the first embodiment. As a result of this structure, the electronic device which is user-friendly and can be used according to various use situations is provided.

For example, by the second flat section 8 being rotated around the second hinge 22 of the coupling section 9 and overlapped with the lower surface of the first flat section 7, the electronic device 2 can be operated with it being held with one hand.

Also, by the first flat section 7 being rotated around the second hinge 22 of the coupling section 9 with respect to second flat section 8 to stand upright, and the standing first flat section 7 being folded at the first folding section 12 to project toward the rear of the device case 3, the electronic device 2 can be used with it being leaned against the protective cover 1.

In this case as well, the second flat section 8 is provided with the first position regulating groove 8a and the second position regulating groove 8b that engage with the edge of the side surface portion 3c positioned below the device case 3. Accordingly, by the edge of the side surface portion 3c positioned below the device case 3 being engaged with one of the first position regulating groove 8a and the second position regulating groove 8b provided on the second flat section 8 selectively, the tilt angle of the device case 3 can be adjusted according to a use situation.

Moreover, when the second flat section 8 is folded at the second folding section 13 with the device case 3 being covered and protected by the protective cover 1, the second flat section 8 is folded into two and the folded portions are overlapped with each other, whereby a memo can be written on a recording paper sheet such as a writing paper sheet serving as the subject 6 while the electronic device 2 is being held with one hand.

Furthermore, when the first flat section 7 is rotated around the second hinge 22 of the coupling section 9 and folded at the first folding section 12 downward relative to the device case 3, the folded portions are overlapped with each other. Then, when a recording paper sheet is interposed between the half of the first flat section 7 folded and positioned below and the second flat section 8, it is partially projected from the device case 3, whereby the input display section 4 of the electronic device 2 can be touched while the memo written on the projected recording paper sheet is being viewed.

Moreover, in the electronic device of the second embodiment, the pause section 30 includes the first magnet 31 provided to the first flat section 7 positioned at one side portion of the coupling section 9, and the second magnet 32 provided to the second flat section 8 positioned at another side portion of the coupling section 9. When the second flat section 8 is tilted to the predetermined angle θ with respect to the first flat section 7, the first magnet 31 and the second magnet 32 attach to each other by the magnetic force so as to hold the second flat section 8 with it tilted at the predetermined angle θ with respect to the first flat section 7. As a result of this structure, imaging timing of the imaging section 5 of the electronic device 2 is ensured and thereby imaging is accurately and favorably performed, as with the first embodiment.

That is, in the electronic device of the second embodiment, the second flat section 8 can be paused at the predetermined angle θ by the pause section 30 when the front surface 3a of the electronic device 2 placed on the first flat section 7 is covered with the second flat section 8, as in the case of the first embodiment. Therefore, imaging timing of the imaging section 5 of the electronic device 2 can be ensured, whereby the subject 6 such as a recording paper sheet or a business card placed on the second flat section 8 can be accurately and favorably imaged always in a predetermined state.

Thus, with the protective cover 1 as well, when the second flat section 8 is tilted to the predetermined angle θ with respect to the first flat section 7, and the rotation of the second flat section 8 is paused by the pause section 20, the open/close detecting section 26 detects an open/close angle of the second flat section 8 with respect to the first flat section 7, and outputs a detection signal for causing the imaging section 5 to perform imaging, as in the case of the first embodiment. Therefore, imaging timing of the imaging section 5 can be kept constant. Also, the pause of the second flat section 8 generates sufficient imaging timing, whereby the subject 6 can be reliably and favorably imaged.

In the first and second embodiments, the detection element 26a of the open/close detecting section 26 is a magnetic sensor such as a Hall element, and the detection target section 26b is a magnet. However, the present invention is not limited thereto. For example, an optical sensor may be used in which the detection element is constituted by a light-emitting element and a light-receiving element, and the detection target section is constituted by a reflecting section. In this case, the optical sensor detects an open/close angle of the protective cover 1 by reflecting light from the light-emitting element of the detection element at the reflecting section of the detection target section and receiving the reflected light at the light-receiving element of the detection element.

Also, the open/close detecting section is not limited to those described above. For example, a mechanical switch section may be used in which the detection element is constituted by a micro switch and the detection target section which pushes the micro switch serving as the detection element is constituted by a part of the coupling section 9. By using this mechanical switch section as an open/close detecting section, the structure can be simplified, and the cost can be reduced.

Moreover, in the first and second embodiments, the present invention is applied to a tablet terminal device as the electronic device 2. However, the present invention is not limited thereto, and may be applied to a flat-type electronic device having a keyboard section and a display section arranged on a plane.

While the present invention has been described with reference to the preferred embodiments, it is intended that the invention be not limited by any of the details of the description therein but includes all the embodiments which fall within the scope of the appended claims.

What is claimed is:

1. An electronic device comprising:
a first flat section which is positioned on a back surface side of a flat-type device body;
a second flat section which openably and closably covers a front surface of the device body; and
a coupling section which couples the first flat section and the second flat section together such that the first flat section and the second flat section are foldable,
wherein the first flat section has a first folding section provided in parallel with the coupling section, and the second flat section has a second folding section provided in parallel with the coupling section,
wherein the first flat section is provided with a device mount plate where the device body is removably mounted,
wherein the device mount plate is provided with a position regulating hook section with which the device body is removably engaged and which regulates a mount position of the device body, and
wherein the position regulating hook section includes pinching hooks which pinch a side portion of the device body positioned opposite to the coupling section, and an engaging hook which removably engages with an engaging section provided at each of four corners of the back surface of the device body.

2. The electronic device according to claim 1, wherein the engaging section of the device body includes a recess provided at each of the four corners of the back surface of the device body, and an engaging bridge section provided in the recess.

* * * * *